United States Patent [19]
Kim et al.

[11] Patent Number: 5,818,268
[45] Date of Patent: Oct. 6, 1998

[54] CIRCUIT FOR DETECTING LEAKAGE VOLTAGE OF MOS CAPACITOR

[75] Inventors: Dae Jeong Kim; Sung Ho Wang, both of Seoul, Rep. of Korea

[73] Assignee: LG Semicon Co., Ltd., Chungcheongbuk-Do, Rep. of Korea

[21] Appl. No.: 780,183

[22] Filed: Dec. 26, 1996

[30] Foreign Application Priority Data

Dec. 27, 1995 [KR] Rep. of Korea .................. 1995/58901

[51] Int. Cl.⁶ ....................................................... G11C 7/00
[52] U.S. Cl. ............................. 327/77; 327/50; 327/530; 327/94; 365/222
[58] Field of Search .................................. 327/77, 94, 50, 327/90, 91, 97, 96, 530; 365/222, 201; 371/21.4

[56] References Cited

U.S. PATENT DOCUMENTS 4,682,306  7/1987  Sakurai et al. ........................ 365/222
5,117,426  5/1992  McAdams .............................. 371/21.4

*Primary Examiner*—Timothy P. Callahan
*Assistant Examiner*—Dinh Le
*Attorney, Agent, or Firm*—Morgan, Lewis & Bockius LLP

[57] ABSTRACT

A circuit for detecting leakage voltage of a MOS capacitor, the detecting circuit including a timing control signal generator for generating a timing control signal; a sample/hold circuit for sampling and holding a first voltage, the sample/hold circuit comprising a switching circuit switched by an output of the timing control signal generator and being operatively coupled to a MOS capacitor; a monitoring capacitor for monitoring a leakage voltage of the MOS capacitor operatively coupled to the sample/hold circuit; a monitoring capacitor precharge circuit for holding a second voltage in the monitoring capacitor; and a leakage voltage detecting portion for detecting when a leakage voltage of the monitoring capacitor is below a predetermined value. The leakage voltage detecting portion is also capable of detecting what value the leakage voltage of the monitoring capacitor is, for example, when the leakage voltage is below the predetermined value.

6 Claims, 5 Drawing Sheets

CIRCUIT FOR DETECTING LEAKAGE VOLTAGE OF MOS CAPACITOR

BACKGROUND OF THE INVENTION

Field of the Invention

The present invention relates to a circuit for detecting the leakage voltage of a MOS capacitor and, more particularly, to a MOS capacitor leakage voltage detecting circuit having a leakage voltage monitoring capacitor for detecting the leakage voltage of a MOS capacitor in a sample/hold circuit.

A conventional circuit using a MOS capacitor in a sample/hold circuit is disclosed in U.S. Pat. No. 5,117,426. A conventional circuit of this type is shown in FIGS. 1 and 2 of the instant disclosure.

As shown in FIGS. 1 and 2, the conventional circuitry includes a delay circuit 10 having an inverter 11 and delays 12, 13, and 14 for inverting and delaying a control signal RLB produced during the access of respective word lines by a well-known DRAM timing and controller circuit (not shown); a controller 20 having a NAND gate 21, inverters 22 and 23, and a NOR gate 24 for logically operating on the output of delay circuit 10 and a HIGH control signal TLWLL produced during a test; a sample/hold circuit 30 having N-type MOSFETs 31 and 33, a sample capacitor 32, a programmable switch 34, a capacitor 35, and a component for sampling and holding a precharged voltage of the word lines according to an output signal of controller 20; a comparator 40 having active load differential amplifiers 41–44 for comparing the hold signal of sample/hold circuit 30 and a word line signal to thereby detect the absence or presence of leakage at the word line; and a driver 50 for outputting a signal detected in comparator 40.

In this configuration, before control signal RLB is input to the input port of controller 20 via delay circuit 10, the output of NAND gate 21 becomes LOW, which is inverted through inverter 22 to trigger and thus render N-type MOSFET 31 conductive via conductive N-type MOSFET 33. By doing so, the precharged voltage of the word line is accumulated in sample capacitor 32 of sample/hold circuit 30. With reference to FIG. 3, when the accumulated voltage (voltage at node N) of sample capacitor 32 is equal to that of the word line (voltage at node P), such as at time $t_0$, control signal RLB, after being delayed by delay circuit: 10, is input to an input port of NAND gate 21 to turn off N-type MOSFETs 31 and 33. Thereafter, the voltage at node P is kept greater than that at node N so that, in comparator 40, the current of N-type MOSFET 44, whose gate receives the higher voltage at node P, becomes larger than the current of N-type MOSFET 43, whose gate receives the lower voltage at node N. For this reason, the voltage at node R drops lower than the logic threshold voltage of inverter 52 of driver 50 so that inverter 52 outputs a HIGH level signal.

However, as shown at time $t_4$ of FIG. 3, when the word line undergoes leakage so that the voltage at node P is lower than that at node N, the current of N-type MOSFET 43 rises more sharply than the current of N-type MOSFET 44, and thus the voltage at node R exceeds the logic threshold voltage of inverter 52. In this state, inverter 52 is inverted to a LOW level to detect whether or not the word line is undergoing leakage.

In the case, however, where sample MOS capacitor 32 or MOS capacitor 35 of sample/hold 30 circuit undergoes leakage, when the word line also undergoes leakage to lower the voltage at node P, MOS capacitors 32 and 35 also undergo leakage to lower the voltage at node N. Therefore, the output of comparator 40 maintains its previous state and is unable to detect the absence or presence of the leakage of the word line. Thus, leakage detection for MOS capacitors in a sample/hold circuit is very important in the field of memory technology.

SUMMARY OF THE INVENTION

Therefore, it is an object of the present invention to provide a MOS capacitor leakage voltage detecting circuit for accurately detecting the leakage voltage of the MOS capacitor of a sample/hold circuit, using a monitoring MOS capacitor. Additional objects and advantages of the invention will be set forth in the description which follows or will be obvious from the description or may be learned by practice of the invention.

To accomplish the objects of the present invention, there is provided a MOS capacitor leakage voltage detecting circuit including: a timing control signal generator for generating a timing control signal; a sample/hold circuit for sampling and holding a first voltage, the sample/hold circuit comprising a switching circuit switched by an output of the timing control signal generator and being operatively coupled to a MOS capacitor; a monitoring capacitor operatively coupled to the sample/hold circuit; a monitoring capacitor precharge circuit for accumulating and holding a second voltage in the monitoring capacitor; and a leakage voltage detecting portion for detecting when a leakage voltage of the monitoring capacitor is below a predetermined value. The leakage voltage detecting portion is also capable of detecting what value the leakage voltage of the monitoring capacitor is when the leakage voltage is below the predetermined value.

Preferably, the monitoring capacitor of the present invention is made to be the same type as the MOS capacitor associated with the sample/hold circuit, and the leakage current of the monitoring capacitor and the leakage current of the MOS capacitor associated with the sample/hold circuit are designed to be the same. By this configuration, the leakage voltage of the MOS capacitor associated with the sample/hold circuit can be accurately measured by measuring the leakage voltage of the monitoring capacitor. Further, the capacitance of the monitoring capacitor is designed to be 1/N of the capacitance of the MOS capacitor, where (N>1), so that the resolution of the leakage voltage detection of the MOS capacitor associated with the sample/hold circuit increases by N times.

It is to be understood that both the foregoing general description and the following detailed description are exemplary and explanatory only. They should not be considered as being restrictive of the invention as claimed.

DETAILED DESCRIPTION OF A PREFERRED EMBODIMENT

Hereinafter, a preferred embodiment of the present invention will be described with reference to the attached drawings.

Figure 1:
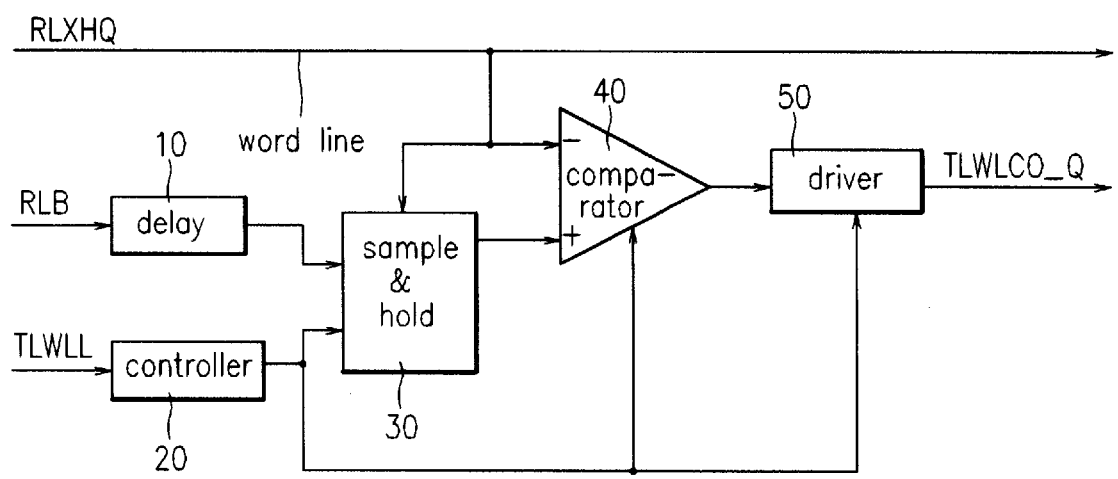
FIG. 1 is a block diagram of a conventional leakage voltage detecting circuit.
Figure 2:
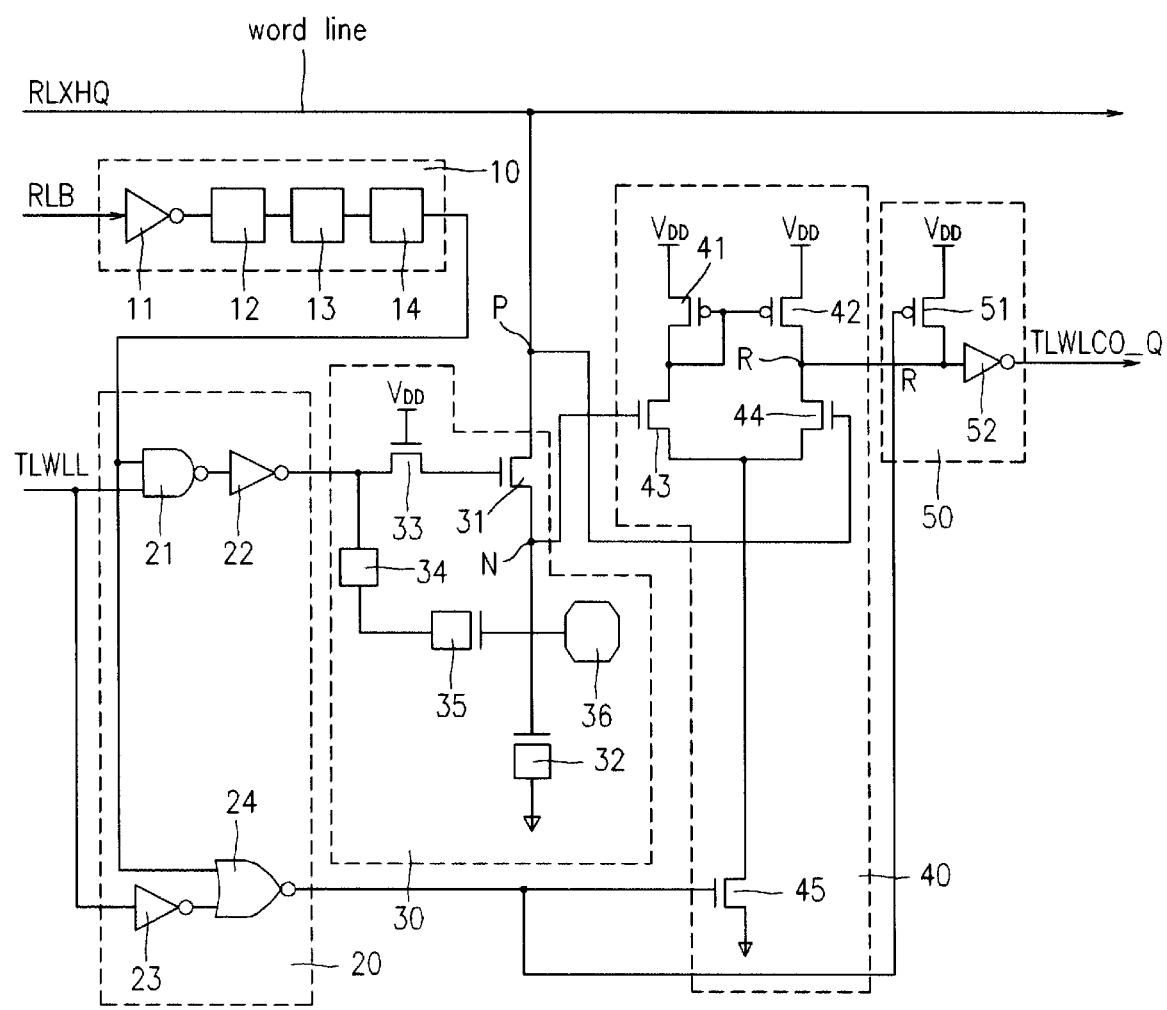
FIG. 2 is a detailed circuit diagram of the leakage voltage detecting circuit of FIG. 1.
Figure 3:
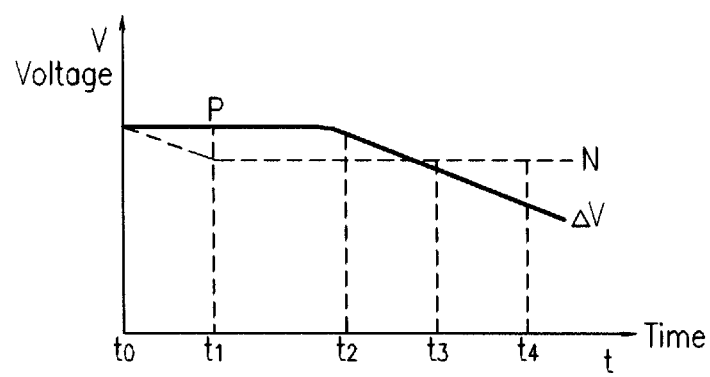
FIG. 3 is a graph of the leakage voltage at node P and the leakage voltage at node N in FIG. 2.
Figure 4:
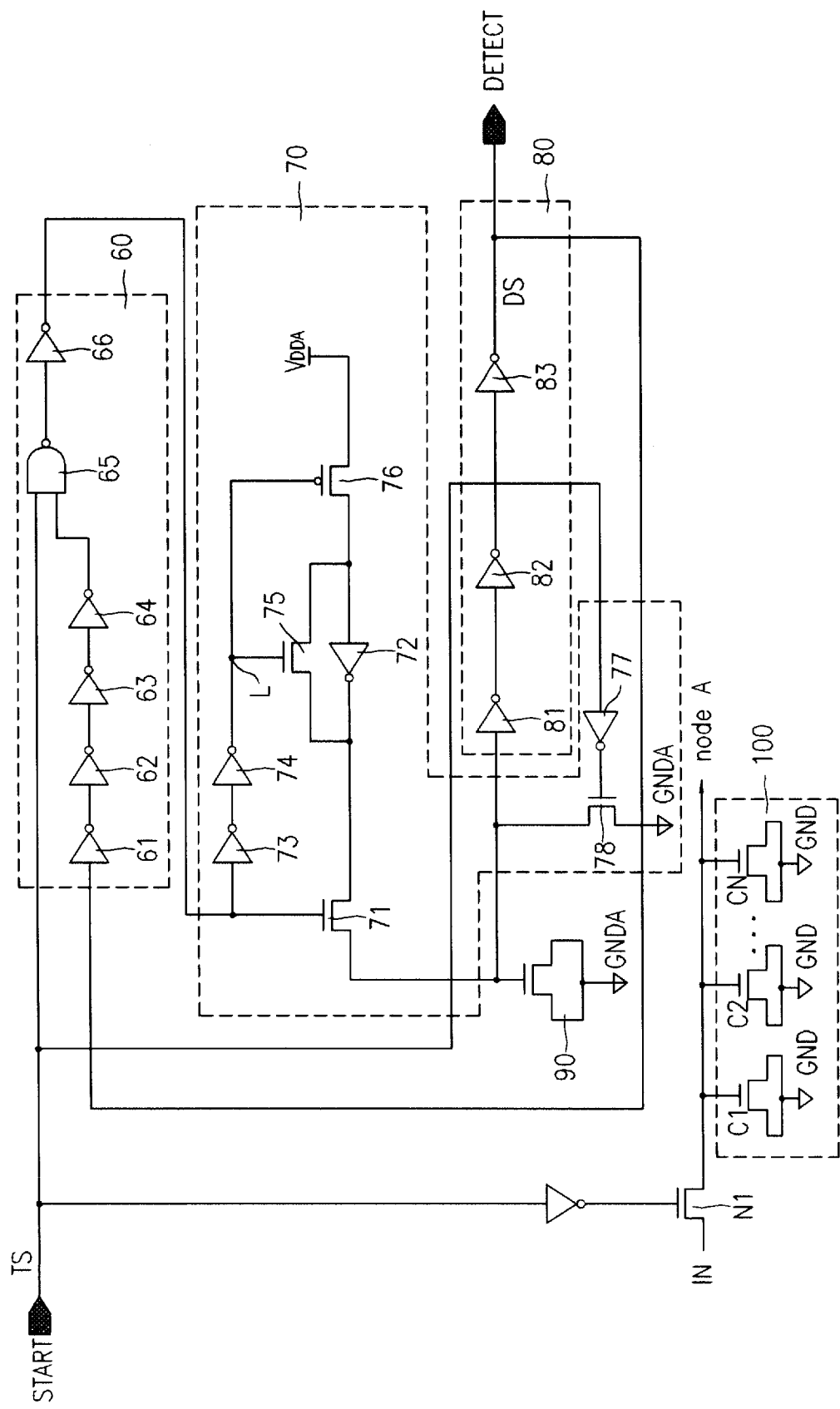
FIG. 4 is a detailed circuit diagram of one embodiment of a leakage voltage detecting circuit for a MOS capacitor of the present invention.

Referring to FIG. 4, a circuit for detecting leakage voltage of a MOS capacitor in accordance with the present invention comprises a timing control signal generator 60 for generating a control signal (timing control signal; a sample/hold circuit 100 for sampling/holding a first voltage according to a command "START" indicative of the starting of leakage detection (i.e. in response to a starting signal of leakage detection); a monitoring capacitor 90 for providing a leakage voltage corresponding to a leakage voltage of sample/hold circuit 100 (i.e. for sampling and holding a second voltage in response to the timing control signal); a monitoring capacitor precharge circuit 70 for generating a second voltage and holding it in monitoring capacitor 90; and a leakage voltage detecting portion 80 for detecting the hold voltage of monitoring capacitor 90 when it undergoes a leakage causing the voltage to go below a predetermined value (i.e. when the voltage of the monitoring capacitor undergoes a leakage causing the voltage of the monitoring capacitor to drop below a predetermined voltage).

Timing control signal generator 60 comprises serially connected inverters 61–64 for causing signal delay, a NAND gate 65 for logically operating on the output of inverter 64 and a leakage test signal TS, and an inverter 66 for inverting the output of NAND gate 65.

Sample/hold circuit 100 is associated with an N-type MOSFET N1 triggered by the TS signal applied to timing control signal generator 60, and comprises a plurality of MOS capacitors $C_1, C_2, \ldots C_N$ for sampling/holding the first voltage when N-type MOSFET N1 is turned on. At the rising edge of TS, N-type MOSFET $N_1$ samples IN and holds the first voltage on the MOS capacitors $C_1, C_2, \ldots, C_N$.

Monitoring capacitor 90 is a general MOS capacitor and is of the same type and capacitance as MOS capacitors $C_1, \ldots, C_N$ of sample/hold circuit 100. The capacitor 90 is set to have 1/N the overall capacitance of the sample/hold MOS capacitors $C_1, \ldots, C_N$ connected in parallel within sample/hold circuit 100.

Monitoring capacitor precharge circuit 70 is constructed in such a manner that an N-type MOSFET 75 is connected in parallel to an inverter 72 having a threshold voltage $V_1$; a P-type MOSFET 76 for preventing floating at both input/output stages of inverter 72 is provided at the input side of the inverter; an N-type MOSFET 71 for transferring voltage V1 in monitoring capacitor 90 is provided at the output side of inverter 72; a time delay means, formed using a pair of inverters 73 and 74, for preventing the input of error charges produced when N-type MOSFET 75 turns off, is connected between the gates of N-type MOSFET 71 and N-type MOSFET 75; and an N-type MOSFET 78 and inverter 77 are provided to discharge residual charges of monitoring capacitor 90 before a predetermined voltage is applied and held therein. Inverter 77 and N-type MOSFET transistor 78 of monitoring capacitor precharge circuit 70 form a reset circuit.

Leakage voltage detecting portion 80 comprises an inverter 81 having a threshold voltage $V_2$ for detecting a voltage when monitoring capacitor 90 is leaked therebelow, and an amplification means including a pair of inverters 82 and 83 for amplifying and outputting the output of inverter 81.

The magnitude of the junction of switching N-type MOSFETs 71 and 78 connected to the gate electrode of monitoring capacitor 30 is set to be equal to that of switching N-type MOSFET $N_1$ connected to the gate electrodes of commonly coupled N-type MOS capacitors $C_1, \ldots, C_N$. By doing so, the amount of leakage electricity from the gate electrode of monitoring capacitor 90 is the same as that from the gate electrodes of N-type MOS capacitors $C_1, \ldots, C_N$.

It should be noted at this point that the to-be-detected leakage voltage of the sample/hold circuit 100 is $\Delta V$. Thus, the ratio of capacitance of monitoring capacitor 90 with respect to the overall capacitance of MOS capacitors $C_1, \ldots, C_N$ of the sample/hold circuit is 1/N, where $N\Delta V = V_1 - V_2$.

Figure 5:
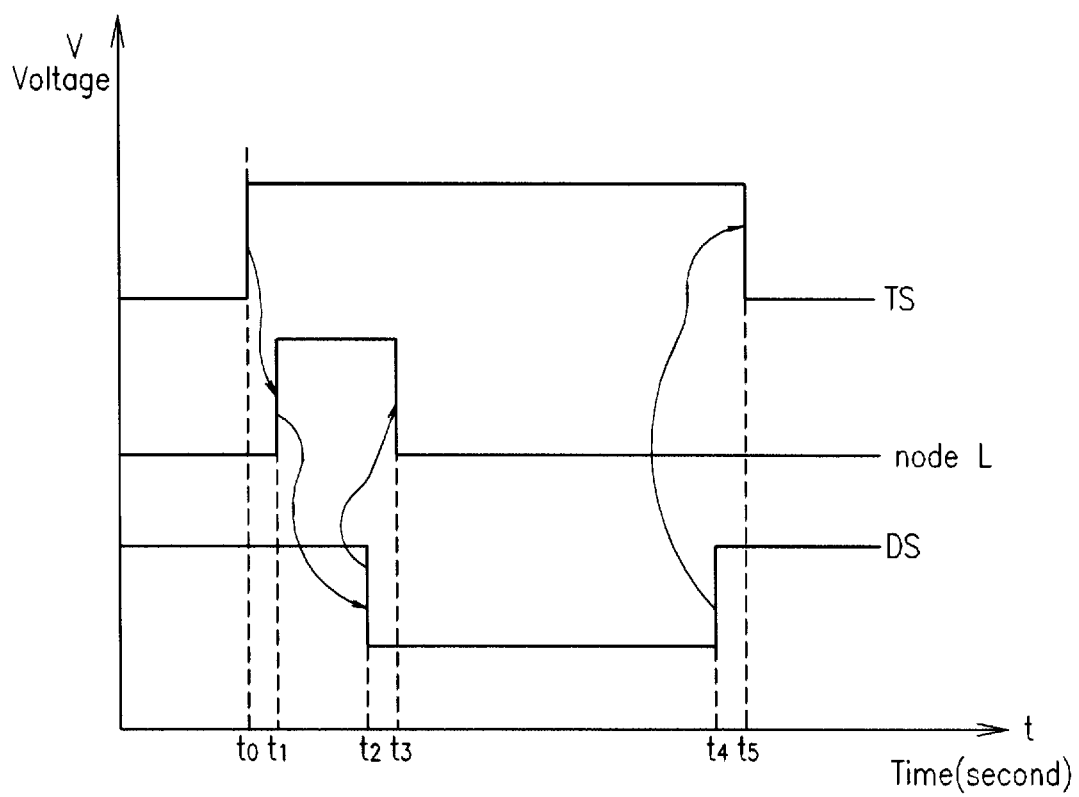
FIG. 5 is a timing diagram of the MOS capacitor leakage voltage detecting circuit.

The operation of the MOS capacitor leakage voltage detecting circuit of the present invention will now be explained with reference to FIG. 5. Prior to time $t_0$, before which leakage test signal TS is not applied at a HIGH level, the gate of monitoring capacitor 90 is at a LOW level (level 0) due to N-type MOSFET 78, and the output of leakage voltage detecting portion 80 is at a HIGH level. Consequently, a signal input to one input port of NAND gate 65 via inverters 61–64 is also at a HIGH level.

When the "START" signal becomes HIGH at time $t_0$, N-type MOSFET $N_1$ is turned off via its associated inverter so that the first voltage (IN) is held in MOS capacitors $C_1, \ldots, C_N$ of sample/hold circuit 100. At time $t_0$, the inputs of NAND gate 65 of timing control signal generator 60 both are at a HIGH level so that the gate outputs a LOW signal. When the HIGH level signal of inverter 66 is input to monitoring capacitor precharge circuit 70, N-type MOSFET 71 is triggered and turned on. Then, after being delayed by inverters 73 and 74 for a predetermined time, the signal causes node L to become HIGH at time $t_1$ so that P-types MOSFET 76 is turned off at the same time N-type MOSFET 75 is on.

The input/output of inverter 72 are electrically connected when N-type MOSFET 75 becomes conductive causing the output of inverter 72 to become threshold voltage $V_1$. This is because, when P-type MOSFET 76 is turned on prior to time $t_1$ such that the input of inverter 72 is precharged with a HIGH level of 5 volts from $V_{DDA}$ and its output is set at a LOW level, N-type MOSFET 75 is turned on to electrically connect the input and output of inverter 72 so that the output of inverter 72 is determined by threshold voltage $V_1$ of inverter 72 regardless of voltage $V_{DDA}$.

Sequentially, monitoring capacitor 90 is charged with threshold voltage $V_1$ (second voltage) of inverter 72. When the voltage at the input stage of inverter 81 of leakage voltage detecting portion 80 is above threshold voltage $V_2$, inverter 81 outputs a LOW signal at time $t_2$, which is then output: as a LOW level detection signal DS via two inverters 82 and 83.

LOW level detection signal DS is input to NAND gate 65 after a predetermined delay via inverters 61–64 of timing signal generator 60 so that NAND gate 65 outputs a HIGH level signal and inverter 66 outputs a LOW level signal to turn off N-type MOSFET 71 of monitoring capacitor precharge circuit 70. By doing so, voltage $V_1$ is held in monitoring capacitor 90 and, at the same time, N-type MOSFET 75 is turned off and P-type MOSFET 76 is turned on at time $t_3$ via inverters 73 and 74.

N-type MOSFET 71 and N-type MOSFET 75 are turned off at different times so that error charges due to the turning off of N-type MOSFET 75 are prevented from being applied to monitoring capacitor 90 via N-type MOSFET 71. When the leakage voltage of voltage $V_1$ held in monitoring capacitor 90 becomes $N\Delta V$, the voltage applied to the input port of inverter 81 of leakage voltage detecting portion 80 becomes threshold voltage $V_2$ (which equals $V_1 - N\Delta V$) so that the output of inverter 81 at time $t_4$ is inverted to a HIGH level.

This HIGH signal is used to produce a HIGH level signal amplified via inverters 82 and 83 at time $t_4$. At the same time, the leakage voltage of MOS capacitors $C_1, \ldots, C_N$ of sample/hold circuit 100 becomes $\Delta V$. Though not shown in the drawings, when a detection signal is converted from LOW to HIGH, leakage test signal TS becomes LOW at time $t_5$ so that the system is reset into the state existing prior to time $t_0$ by the reset circuit of monitoring capacitor precharge circuit 70.

According to the present invention, the measurable leakage voltage $N\Delta V$ of monitoring capacitor 90 is determined by the difference between threshold voltage $V_1$ of inverter 72, which determines the hold voltage of monitoring capacitor 90, and logic threshold voltage $V_2$ of inverter 81, which detects the leakage of monitoring capacitor 90. In the case where the size of inverters 72 and 81 is designed to be larger, the inverters will be even less susceptible to process variations. Although the threshold voltages $V_1$ and $V_2$ may vary with supplied voltage or temperature, the amount of difference between the threshold voltages $V_1$ and $V_2$ of the inverters, when designed in the same manner and at the same position, is very resistant to process or supplied voltage variations.

Using the monitoring capacitor does not affect the charges held in the capacitor of the sample/hold circuit due to the detection of leakage voltage. The capacitance of the monitoring capacitor can be designed to be 1/N of the capacitance of the MOS capacitor of the sample/hold circuit.

Equalizing the leakage current can increase the resolution of the leakage voltage of the MOS capacitor of the sample/hold circuit by N times (for instance, ten times). This makes the leakage voltage of the capacitor of the sample/hold circuit become about 10 mV, sharply increasing precision. In the detection mode, a slight amount of current runs only through inverter 81, reducing current consumption. The induction of error voltage of monitoring capacitor 90 by a clock feed-through when N-type MOSFET 71 is open can be avoided by designing to compensate for the reduction of voltage in accordance with the induction with the magnitude of the threshold voltage of inverter 81 of leakage voltage detecting portion 80.

In the embodiment of the present invention, the monitoring capacitor is not necessarily confined to the MOS capacitor; it can be applied to the capacitor of a memory cell, as the case may be. For inverters 61–64, inverters 73 and 74, and inverters 82 and 83 used as delay means, the number of inverters can be selected appropriately according to the desired timing. The voltage held in the capacitor of the sample/hold circuit and the voltage held in the monitoring capacitor are preferably equal. However, it is envisioned that a difference may exist between them as long as the difference does not affect the leakage current of the capacitors. Thus, the present invention describes a MOS capacitor leakage voltage detecting circuit in which a monitoring capacitor having 1/N times the capacitance of the MOS capacitor and characteristics identical to the MOS capacitor is provided for detecting a voltage drop of the MOS capacitor in sample and hold circuit 100 under a reference value caused by the leakage voltage. The threshold voltages $V_1$ and $V_2$ of the first and second inverters 72 and 81 are used as a reference voltage.

Those skilled in the art will recognize that various modifications and variations of the present invention can be made without departing from the spirit or scope of the invention. It is intended that such modifications and variations be covered by the invention, provided that they come within the scope of the appended claims and their equivalents.

What is claimed is:

1. A circuit for detecting leakage voltage of a MOS capacitor, the circuit comprising:

a timing control signal generator for generating a timing control signal in response to a starting signal of a leakage detection;

a sample/hold circuit for sampling and holding a first voltage in response to the starting signal of the leakage detection;

a monitoring capacitor precharge circuit for generating a second voltage in response to the timing control signal;

a monitoring capacitor coupled to the monitoring capacitor precharge circuit for providing a leakage voltage corresponding to a leakage voltage of the sample/hold circuit; and a leakage voltage detecting circuit for detecting a voltage of the monitoring capacitor when the voltage of the monitoring capacitor undergoes a leakage causing the voltage of the monitoring capacitor to drop below a predetermined voltage, wherein the monitoring capacitor precharge circuit includes:

a delay circuit for delaying the timing control signal;
   a first inverter,
   a first switching circuit connected to input and output stages of the first inverter;
   a second switching circuit coupled to the output stage of the first inverter, wherein the timing control signal controls the first and second switching circuits; and
   a third switching circuit for discharging the monitoring capacitor in response to the starting signal of the leakage detection,
   wherein the first inverter charges the monitoring capacitor in response to the second voltage.

2. The circuit as claimed in claim 1, wherein the leakage voltage detecting circuit includes a second inverter having a threshold voltage and detects when the voltage of the monitoring capacitor is below the predetermined voltage determined by a difference between a threshold voltage of the first inverter and a threshold voltage of the second inverter.

3. The circuit as claimed in claim 2, wherein the threshold voltage of the first inverter and the threshold voltage of the second inverter are determined by the first inverter and the second inverter, respectively.

4. The circuit as claimed in claim 1, wherein the first voltage and the second voltage are substantially equal.

5. The circuit as claimed in claim 1, wherein the monitoring capacitor is of the same type as capacitors of the sample/hold circuit and wherein a total capacitance of the capacitors of the sample/hold circuit is equal to 1/N of a capacitance of the monitoring capacitor, wherein N is larger than 1.

6. The circuit as claimed in claim 3, wherein the leakage voltage detecting circuit includes a second inverter having a threshold voltage smaller than the second voltage, and the voltage of the monitoring capacitor is determined by a difference between the threshold voltage of the first inverter, and the threshold voltage of the second inverter.

* * * * *